United States Patent
Celii et al.

(10) Patent No.: US 7,300,883 B2
(45) Date of Patent: Nov. 27, 2007

(54) METHOD FOR PATTERNING SUB-LITHOGRAPHIC FEATURES IN SEMICONDUCTOR MANUFACTURING

(75) Inventors: Francis G. Celii, Dallas, TX (US); Brian A. Smith, Plano, TX (US); James Blatchford, Richardson, TX (US); Robert Kraft, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 115 days.

(21) Appl. No.: 10/930,228

(22) Filed: Aug. 31, 2004

(65) Prior Publication Data

US 2006/0046498 A1    Mar. 2, 2006

(51) Int. Cl.
*H01L 21/336* (2006.01)
*H01L 21/302* (2006.01)
*H01L 21/461* (2006.01)
*H01L 21/31* (2006.01)
*H01L 21/469* (2006.01)

(52) U.S. Cl. .................... 438/736; 438/780; 438/302

(58) Field of Classification Search ................ 438/736, 438/780, 302
See application file for complete search history.

(56) References Cited

U.S. PATENT DOCUMENTS

| | | | | |
|---|---|---|---|---|
| 5,472,564 A | * | 12/1995 | Nakamura et al. | 216/51 |
| 6,548,423 B1 | * | 4/2003 | Plat et al. | 438/780 |
| 6,673,685 B2 | * | 1/2004 | Mori et al. | 438/302 |
| 6,794,230 B2 | * | 9/2004 | Huang et al. | 438/154 |
| 6,828,205 B2 | * | 12/2004 | Tsai et al. | 438/313 |
| 7,008,866 B2 | * | 3/2006 | Huang et al. | 438/585 |
| 2005/0098091 A1 | * | 5/2005 | Babich et al. | 117/4 |

\* cited by examiner

*Primary Examiner*—Chuong A. Luu
(74) *Attorney, Agent, or Firm*—Rose Alyssa Keagy; W. James Brady; Frederick J. Telecky, Jr.

(57) ABSTRACT

A method of forming a gate electrode (24') for a metal-oxide-semiconductor (MOS) integrated circuit is disclosed. A hardmask layer (26), for example formed of silicon-rich nitride, is deposited over a polysilicon layer (24) from which the gate electrode (24') is to be formed. An anti-reflective coating, or bottom anti-reflective coating or BARC, layer (29) is then formed over the hardmask layer (26), and photoresist (30) is photolithographically patterned to define the pattern of the gate electrode (24'), although to a wider, photolithographic, width (LW). The pattern is transferred from the photoresist (30) to the BARC layer (29). The remaining elements of the BARC layer (29) are then trimmed, preferably by a timed isotropic etch, to a sub-lithographic width (SW). This pattern is then transferred to the hardmask layer (26) by an anisotropic etch of that layer, using the trimmed BARC elements (29) as a mask. The hardmask layer elements (26') then mask the etch of the underlying polysilicon layer (24), to define the gate electrodes (24'), having gate widths that are narrower than the minimum dimension available through photolithography.

19 Claims, 6 Drawing Sheets

METHOD FOR PATTERNING SUB-LITHOGRAPHIC FEATURES IN SEMICONDUCTOR MANUFACTURING

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor integrated circuit manufacturing, and is more specifically directed to the photolithographic patterning and etch of device features.

In the field of integrated circuit manufacturing, a fundamental goal is to design and manufacture integrated circuits to be as small as possible. As is well known in this art, the manufacturing cost of an integrated circuit corresponds strongly to the wafer area occupied by each integrated circuit die or chip. This is because the chip area correlates directly to the number of possible integrated circuits per manufactured wafer, and because the theoretical yield, for a given manufacturing defect density, increases as chip area decreases. In addition, smaller feature sizes result in improved device performance and increased functionality for a given chip area.

In the manufacture of metal-oxide-semiconductor (MOS) integrated circuits, the gate electrode is typically the physical feature that is the smallest feature defined by a photolithographic pattern. As fundamental in the art, the size of the gate electrode in turn defines the MOS transistor channel length, which is an important physical parameter in defining both the device density and also the transistor performance in an MOS integrated circuit. Indeed, specific processing technologies are typically referred to by the nominal transistor channel length. And in turn, the transistor gate electrode width is often referred to as a "critical dimension" or "CD" feature of the integrated circuit.

Conventional photolithography processes are used to form integrated circuit features. As is fundamental in the art, photolithography involves the exposure to light of a photosensitive material, typically a photosensitive polymer film referred to as photoresist, that is dispensed over the material that is to be selectively etched in forming the integrated circuit at the surface of a semiconductor substrate (typically a semiconductor wafer). After exposure of the photoresist to light, through a photomask or reticle, and subsequent developing, selected portions of the photoresist film are removed to leave cross-linked photoresist structures in a pattern corresponding to the pattern of the photomask. The remaining photoresist pattern defines the locations of the underlying material that are to be protected from a subsequent etch, in turn defining the locations of the integrated circuit structures to be formed from that material. In some cases, the photoresist masks the etch of an insulating material that itself becomes a mask (i.e., a "hard" mask) of the etch of another layer underlying that insulating material. Either through the action of the etch itself, or a subsequent cleanup or ash, any remaining photoresist is removed from the wafer prior to the next deposition or other manufacturing process.

In recent years, the "critical dimension" of MOS transistor gate widths has become significantly smaller than 500 nm. These small dimensions have been attained using photolithography, despite the recurring predictions that photolithography is limited in the feature sizes that it can define. These predictions have proven false because of important advances in the field, including the use of ever-shorter wavelengths of light, the use of more complex photomasks (e.g., phase-shift photomasks), anti-reflective coatings, and the like.

In addition, certain etch techniques are used to form features that are even smaller than those that can be photolithographically defined, such features sometimes referred to as "sub-lithographic" features. These conventional processes typically involve post-development blanket reduction of the size of the masking features. FIGS. 1a through 1d illustrate, in cross-section, an example of such a conventional process, for the typical example of forming a sub-lithographic polysilicon gate electrode.

FIG. 1a illustrates substrate 2, and overlying gate dielectric layer 3. Polysilicon layer 4 overlies gate dielectric layer 3, and is the layer that will be patterned and etched according to this conventional photolithographic process. In this example, a two-layer hardmask will be in place during the polysilicon etch. Silicon-rich silicon nitride layer 6 overlies polysilicon layer 4, and silicon-oxynitride layer 8 overlies silicon-rich nitride layer 6. The relative thicknesses of silicon-rich nitride layer 6 and silicon-oxynitride layer 8 are selected, in this conventional example, to minimize reflections of the light in the photolithographic exposure. As is also shown in FIG. 1a, photoresist 10 overlies a portion of silicon oxynitride layer 8, at a location corresponding to the location of the eventual gate electrode to be formed in polysilicon layer 4. At the stage shown in FIG. 1a, photoresist 10 has been exposed to masked electromagnetic energy (typically of a wavelength in the so-called "deep UV" range), and has been developed so that photoresist 10 in its cross-linked state remains in the desired pattern, with the remainder of the photoresist (not cross-linked by the exposure and development) removed from the structure. Photoresist 10 may either be of the positive or negative type, with the corresponding photomask or reticle (i.e., positive or negative) used during exposure.

Typically, the width W of the remaining photoresist element 10 is at or near the smallest dimension that can be photolithographically patterned. According to current technology, this width W is about 100 nm. However, in this example, the eventual width of the gate electrode to be formed in polysilicon layer 4 is substantially narrower than this 100 nm photolithographic limit. According to this conventional method, therefore, photoresist element 10 is "trimmed", or narrowed, by way of a timed isotropic etch. The result of this trim operation is illustrated in FIG. 1b, with trimmed photoresist element 10' shown. As evident from FIG. 1b, the isotropic nature of this trim etches into both sides of photoresist 10, and also reduces its thickness from the top by an amount approximately one-half of its width reduction. The new width W' of trimmed photoresist element 10' may be on the order of 50 nm.

After the trim operation illustrated in FIG. 1b, photoresist element 10' is then used to mask the etch of the underlying hardmask layers including, in this example, silicon oxynitride layer 8 and silicon-rich nitride layer 6. This etch is preferably an anisotropic etch, so that the dimension of the resulting hardmask corresponds to that of trimmed photoresist element 10'. The result of this etch is illustrated in FIG. 1c, with the remaining portions of silicon oxynitride layer 8 and silicon-rich nitride layer 6 remaining in place over polysilicon layer 4 at the location defined by photoresist 10. As evident from FIG. 1c, the completion of this etch can thin silicon oxynitride layer 8.

Polysilicon layer 4 is then anisotropically etched, using the remaining hardmask of silicon oxynitride layer 8 and silicon-rich nitride layer 6 to protect the eventual location of the polysilicon gate electrode. The protected portion of polysilicon 4 as a transistor gate electrode is illustrated in FIG. 1d. Some portion of the hardmask, most likely the lower silicon-rich nitride layer 8 but also possibly including silicon oxynitride layer 8, remains over the gate electrode as shown in FIG. 1d; this residue will be removed by a subsequent cleanup or etch, to permit contact to polysilicon 4 (at a wider location than that shown in FIG. 1d).

This conventional defining of the critical dimension feature of the polysilicon gate electrode, using the trimming of photoresist, works well in theory. In practice, however, especially considering the extremely narrow feature sizes and the relatively large film thicknesses for those small features, this conventional approach has some significant limitations.

A first limitation is illustrated in FIG. 1e, in which post-trim photoresist element 10" is illustrated. If the aspect ratio of height (thickness) to width of photoresist element 10" is too high, such as 3:1 or higher, photoresist element 10" may not be able to structurally survive the trim operation. More specifically, stress deformation of photoresist element 10" occurs as a result of the trim, causing photoresist element 10" to lean to one side and, in the extreme case, to detach and fall. As a result, deformed photoresist element 10" cannot properly protect nor accurately define the hardmask of the underlying silicon oxynitride layer 8 and silicon-rich nitride layer 6. Completion of the polysilicon etch process results in unduly narrowed, broken, or even completely missing polysilicon gate electrode structures, as illustrated in the plan view of FIG. 1f. As shown in FIG. 1f, polysilicon gate electrodes 4" are broken as they extend over moat region 5 (i.e., the location of source and drain diffusions) between wider polysilicon contact structures 4. Obviously, in the case of FIG. 1f, the broken and narrowed polysilicon gate electrodes 4" are not capable of operating as transistor gate electrodes to control the current between opposing sides of moat region 5 (i.e., the source and drain).

Even if the structural integrity of photoresist elements 10" can be maintained, this conventional process has other limitations. As described above, the hard mask layers include both silicon oxynitride layer 8 and silicon-rich nitride layer 6, of thicknesses that are selected to eliminate optical reflections during exposure, which constrains the selection of film thicknesses. But silicon oxynitride layer 8 is difficult to remove with a wet cleanup after polysilicon etch. Accordingly, in the conventional process of FIGS. 1a through 1d, the polysilicon etch must be designed so that silicon oxynitride layer 8 is fully consumed by the time that the etch is completed. This constraint on the etch process has been observed to limit the performance of the etch of polysilicon layer 4 itself, resulting in less-than-optimal defining of the polysilicon gate electrodes and other critical dimension features.

BRIEF SUMMARY OF THE INVENTION

It is therefore an object of this invention to provide a method of defining and forming extremely small physical features in the manufacture of integrated circuits.

It is a further object of this invention to provide such a method in which the features are smaller in at least one dimension than the minimum size that can be photolithographically patterned for the process.

It is a further object of this invention to provide such a method in which the trimming of a masking element results in a structure with sound structural integrity.

It is a further object of this invention to provide such a method in which the etch of the layer from which the feature is not constrained by requiring the removal of a masking layer.

Other objects and advantages of this invention will be apparent to those of ordinary skill in the art having reference to the following specification together with its drawings.

The present invention may be implemented into a photolithographic process of defining a sub-lithographic feature, such as a transistor gate electrode in metal-oxide-semiconductor technology. A hardmask layer, such as silicon-rich nitride, is formed over the layer from which the feature is to be formed (e.g., polysilicon). An anti-reflective coating is then formed over the hardmask layer. A photoresist element is then defined by conventional photolithography, to a feature size that is larger than the eventual desired feature. The anti-reflective layer is etched, so that the pattern of the photoresist element is transferred to the anti-reflective layer. An isotropic etch is then applied to the anti-reflective layer, trimming its width to the desired sub-lithographic critical dimension. The hard mask, and in turn the underlying layer, are then etched to define the sub-lithographic physical feature.

DETAILED DESCRIPTION OF THE INVENTION

The present invention will be described in connection with its preferred embodiment, namely as implemented into a method of forming a transistor gate electrode in a metal-oxide-semiconductor (MOS) integrated circuit, because the invention is believed to be especially beneficial when used in such an application. However, it is contemplated that this invention can also provide similar significant benefits in the formation of other integrated circuit features, for integrated circuits of other types and device technologies. Accordingly, it is to be understood that the following description is provided by way of example only, and is not intended to limit the true scope of this invention as claimed.

Referring now to FIGS. 2a through 2f, a method of defining a small feature in an integrated circuit according to the preferred embodiment of the invention, specifically in forming polysilicon gate electrodes in an MOS integrated circuit, will now be described. As mentioned above and as known in the art, the gate electrode in an MOS device is typically the smallest feature in the integrated circuit, because the width of the gate electrode defines the electrical channel length of the MOS transistor. The transistor channel length defines important electrical parameters of the integrated circuit, including switching speed and drive capability, and also effectively defines the density of the active devices that are to be formed in the integrated circuit. Accordingly, it is a common desire to form the gate electrode of the highest performance MOS transistors to have as small a width as practicable. According to this embodiment of the invention, the gate electrode width to be formed is smaller than the smallest dimension that can be patterned with available photolithography technology, and as such this dimension can be referred to as "sub-lithographic".

FIGS. 2a through 2f will illustrate the formation of a single gate electrode from a layer of polysilicon (i.e., polycrystalline silicon), by way of the photolithography and etching of a number of layers at or near a semiconducting surface of a body. It will, of course, be understood by those skilled in the art having reference to this specification that many thousands (indeed millions) of elements will be simultaneously formed along with the formation of the single gate electrode shown in these Figures, as the integrated circuit containing this single gate electrode will typically include hundreds of thousands of such elements, and is formed on a wafer simultaneously with many other similar integrated circuits. The dimensions of these other elements may of course vary from that shown in these Figures. The single example to which this description pertains is contemplated to be illustrative of a minimum feature size gate electrode formed according to this preferred embodiment of the invention.

Figure 1A:
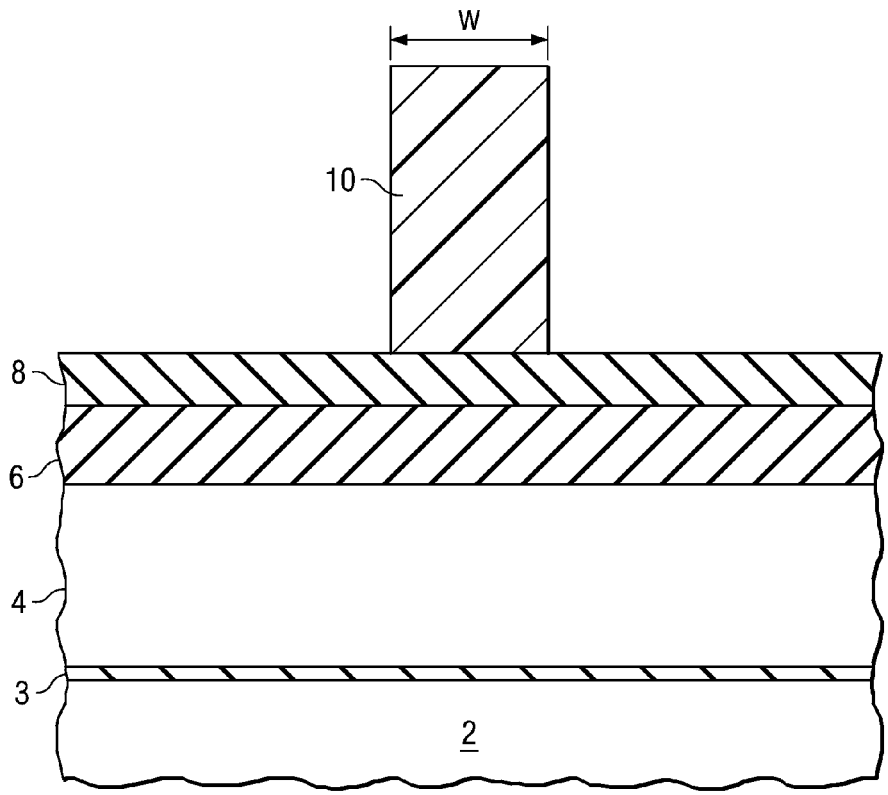
FIGS. 1a through 1d are cross-sectional views illustrating a conventional polysilicon etch process.
Figure 1B:
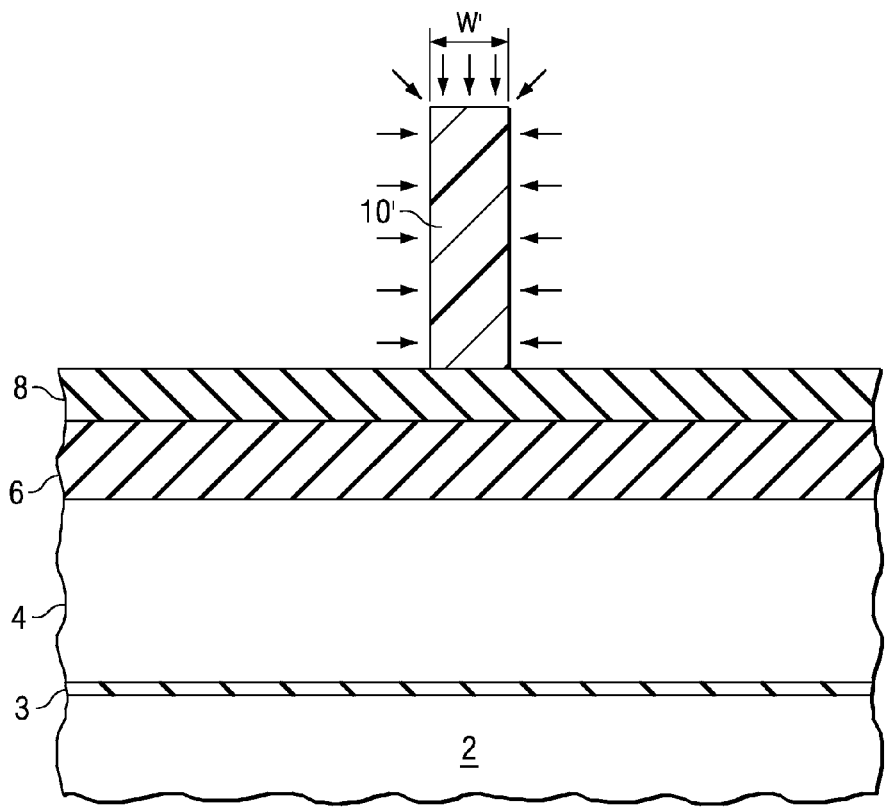
Figure 1C:
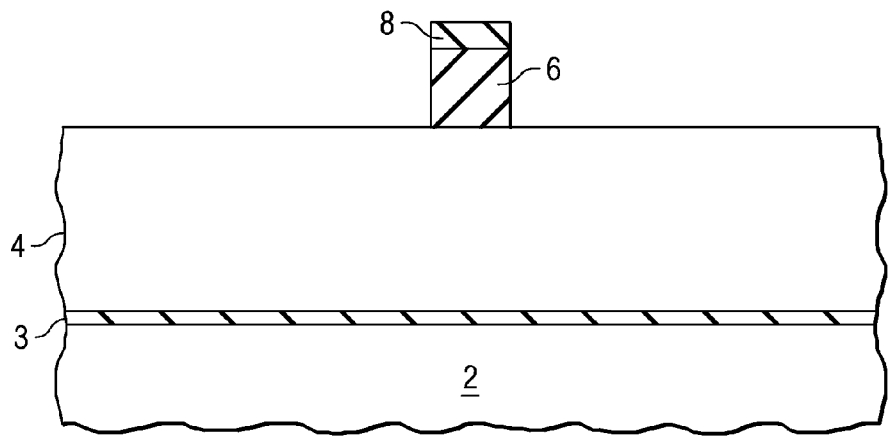
Figure 1D:
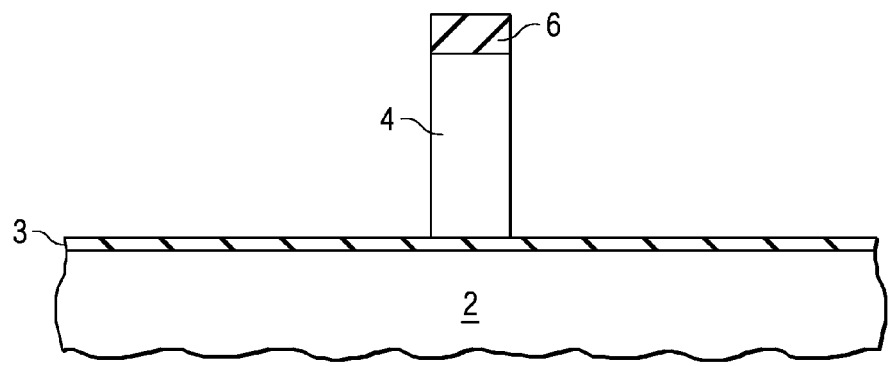
Figure 1E:
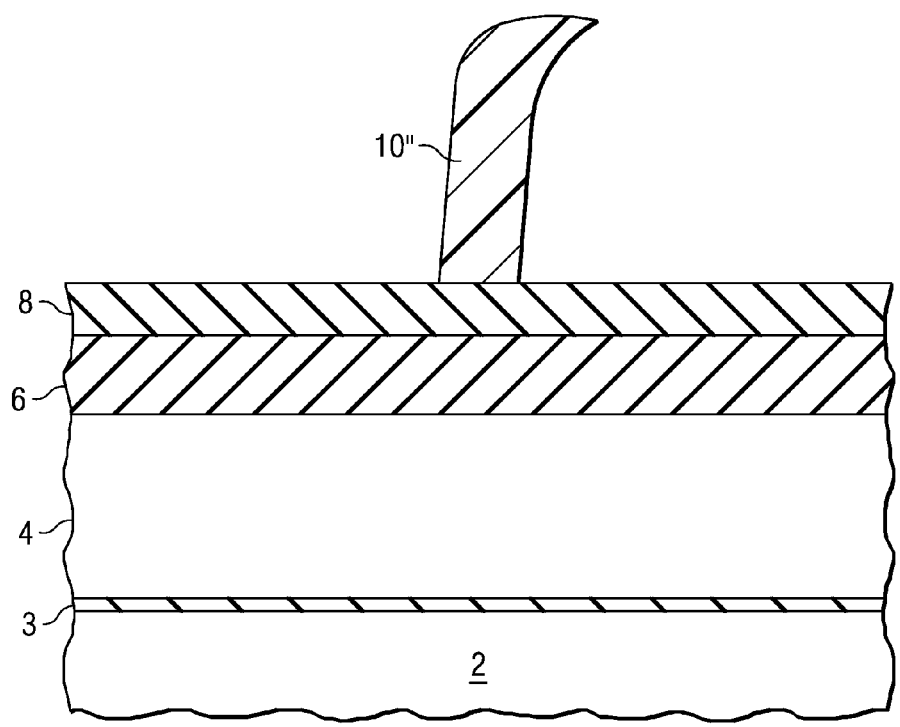
FIGS. 1e and 1f are cross-sectional and plan views illustrating failure modes resulting from the conventional process of FIGS. 1a through 1d.
Figure 1F:
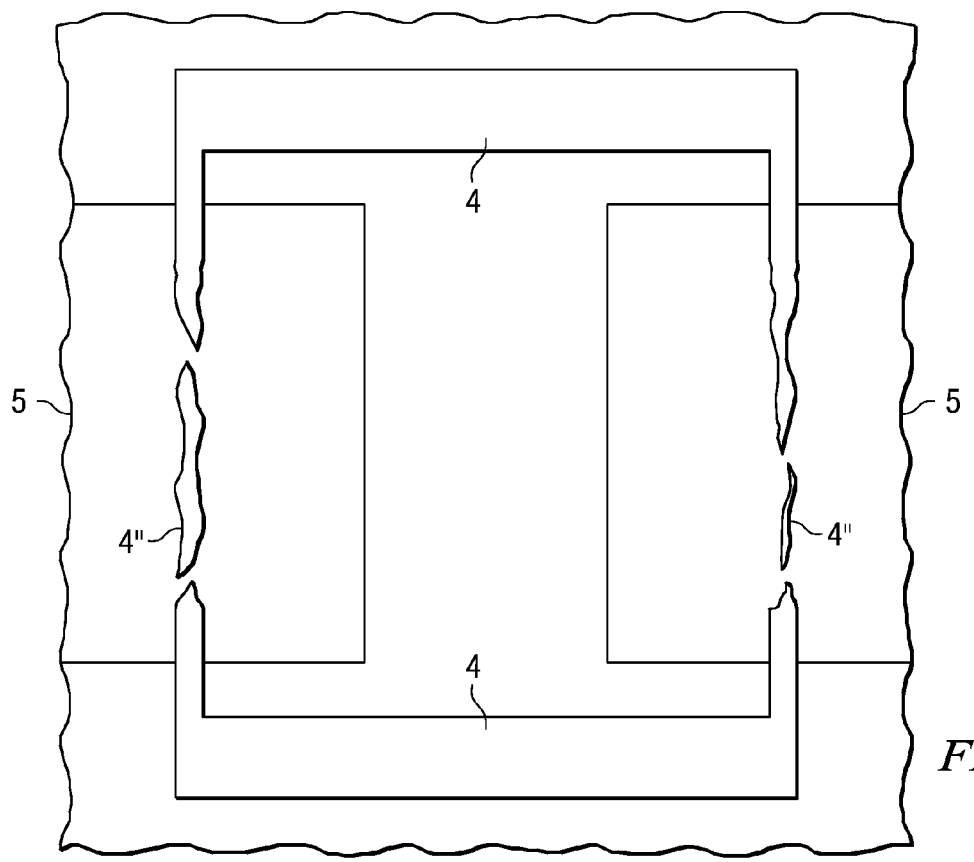
Figure 2A:
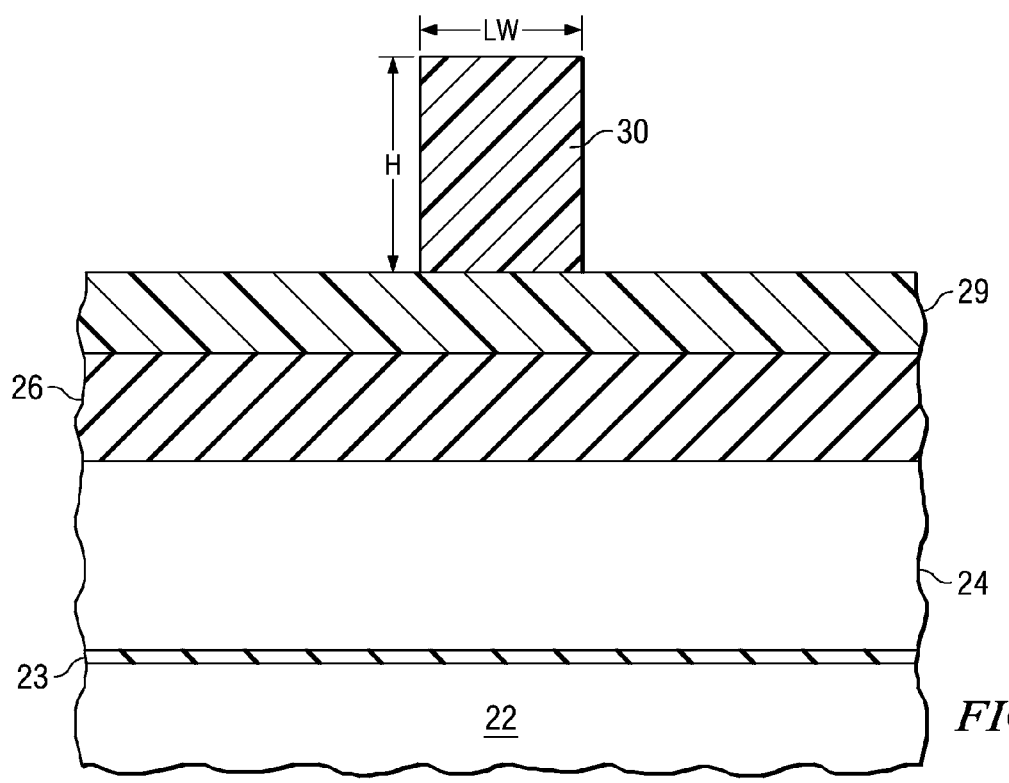
FIGS. 2a through 2f are cross-sectional views illustrating a method of forming small physical features in the manufacture of an integrated circuit according to the preferred embodiment of the invention.
Figure 2B:
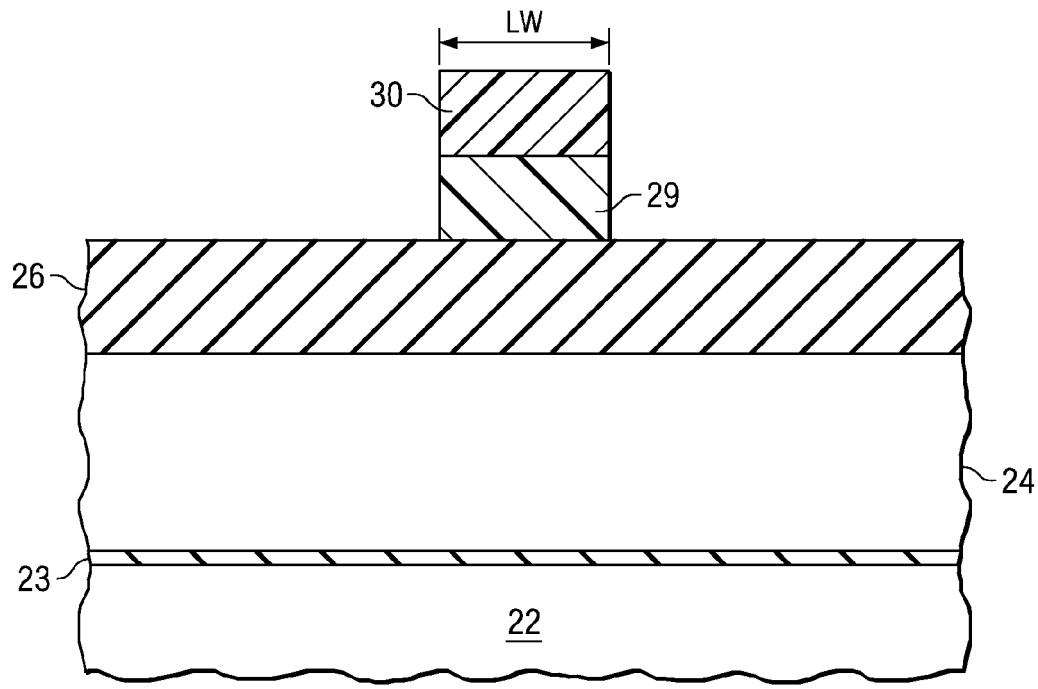

FIG. 2a illustrates, in cross-section, a partially formed integrated circuit including a substrate 22, and an overlying gate dielectric film 23. Substrate 22 can be a single-crystal bulk substrate as suggested by FIG. 2a, or alternatively an epitaxial layer on a bulk substrate, an epitaxial silicon-on-insulator (SOI) film, or another semiconductor layer into which active devices can be formed at the surface. As known in the art, particularly for complementary MOS (CMOS) integrated circuits, p-type and n-type doped regions of the surface of substrate 22, referred to as wells or tanks, are typically formed into substrate 22; transistor source and drain regions are then later formed into the wells or tanks, as well-known in the art. In addition, isolation structures are also typically formed at locations of the surface of substrate 22, to define so-called "moat" regions of the surface (typically at the surface of doped wells) at which the transistor source and drain regions will be formed. While these and other such structures, disposed below gate dielectric 23, are not shown in FIGS. 2a through 2f for the sake of clarity, those skilled in the art having reference to this specification will of course understand that such features will be present at and within substrate 22, according to the particular process flow into which the invention is implemented.

Gate dielectric 23 may be a conventional silicon dioxide layer, for example formed by thermal oxidation of the surface of substrate 22, or may be formed of another material including nitrided silicon dioxide, other forms of silicon oxynitride, silicon nitride, laminated thin films of silicon dioxide and silicon nitride. Other materials used as gate dielectric films include the metal oxides of $Ta_2O_5$, $TiO_2$, $Y_2O_3$, $CeO_2$, $ZrO_2$, $HfO_2$, and $Al_2O_3$. For such devices as ferroelectric memories, ferroelectric materials such as BST (barium strontium titanate) can serve as gate dielectric 23.

Polysilicon layer 24 is disposed over gate dielectric 23 in this embodiment of the invention, and is the layer from which the eventual gate electrode will be formed. Of course, other materials may alternatively be used as the gate electrode material of layer 24, such materials including metals such as tungsten, and metal compounds such as titanium silicide, tungsten silicide, and the like. For purposes of this description, polysilicon is the exemplary material of layer 24.

Hardmask layer 26 overlies polysilicon layer 24, and is of a selected material of sufficient thickness to protect selected locations of polysilicon layer 24 from the polysilicon etch. Preferably, the material selected for hardmask layer 26 is a material that can be easily removed, for example by way of a wet cleanup, after the etch of polysilicon layer 24. A preferred material for hardmask layer 26 is silicon-rich nitride, which, as known in the art, refers to a silicon nitride film in which a higher than stoichiometric density of silicon is provided (i.e., $Si_xN_y$, where the ratio of x:y is greater than 3:4). For example, hardmask layer 26 of silicon-rich nitride may be deposited by chemical vapor deposition to a thickness of on the order of 50 nm, for a polysilicon layer 24 having a thickness of about 160 nm. Alternatively, it has been discovered that anti-reflective properties may be improved by using a silicon-rich oxynitride as hardmask layer 26.

According to this preferred embodiment of the invention, bottom anti-reflective coating (BARC) layer 29 is deposited over hardmask layer 26. BARC layer 29 is a conventional anti-reflective coating, as known in the art, to reduce undesired reflections and their effect in photolithography. The material used for BARC layer 29, and its thickness, depends on the wavelength of light to be used. Typically, BARC layer 29 is an organic layer designed for the particular wavelength of light to be used in the photolithography, and having a selected refractive index. It is contemplated that those skilled in the art having reference to this specification will be readily able to select the appropriate material for BARC layer 29 in specific applications.

At the stage of the process illustrated in FIG. 2a, photoresist element 30 is shown as disposed at a selected location of the structure, following its exposure and developing in the photolithography process. Photoresist 30 may be either a negative (cross-linking occurring in unexposed photoresist) or a positive photoresist (cross-linking occurring in exposed photoresist), with the photomask or reticle arranged as a positive or negative mask accordingly. The photomask or reticle of course defines the location at which photoresist element 30 is to remain after developing. In either case, photoresist element 30 remaining after developing as shown in FIG. 2a consists of cross-linked photopolymer.

As shown in FIG. 2a, photoresist element 30 has a width LW that is defined by the photolithography process; preferably, this width LW is at or near the minimum critical dimension that can be reliably formed by photolithography for the particular process technology being used. For example, current deep UV (<200 nm wavelength) photolithography can reliably define features as small as about 100 nm. According to this preferred embodiment of the invention, however, photoresist element 30 is not called upon to mask the definition of the entire hardmask layer. As such, its aspect ratio (height H to width LW) need not be particularly severe. For example, the height (or thickness) H of photoresist 30 is preferably less than three times the minimum width W, and preferably defines an aspect ratio that is 2:1 or less.

Following the patterning (exposure and developing) of the photoresist pattern defining photoresist element 30, this pattern is transferred to BARC layer 29 according to the preferred embodiment of the invention. As shown in FIG.

2b, this pattern transfer is performed by etching BARC layer 29 with a suitable reagent, preferably anisotropically, using photoresist element 30 as a mask. Photoresist element 30 is also thinned by this BARC etch operation, with the extent of this thinning depending upon the particular reagent and etch conditions. BARC layer 29 is removed from other locations of the surface except where masked by photoresist elements 30.

Figure 2C:
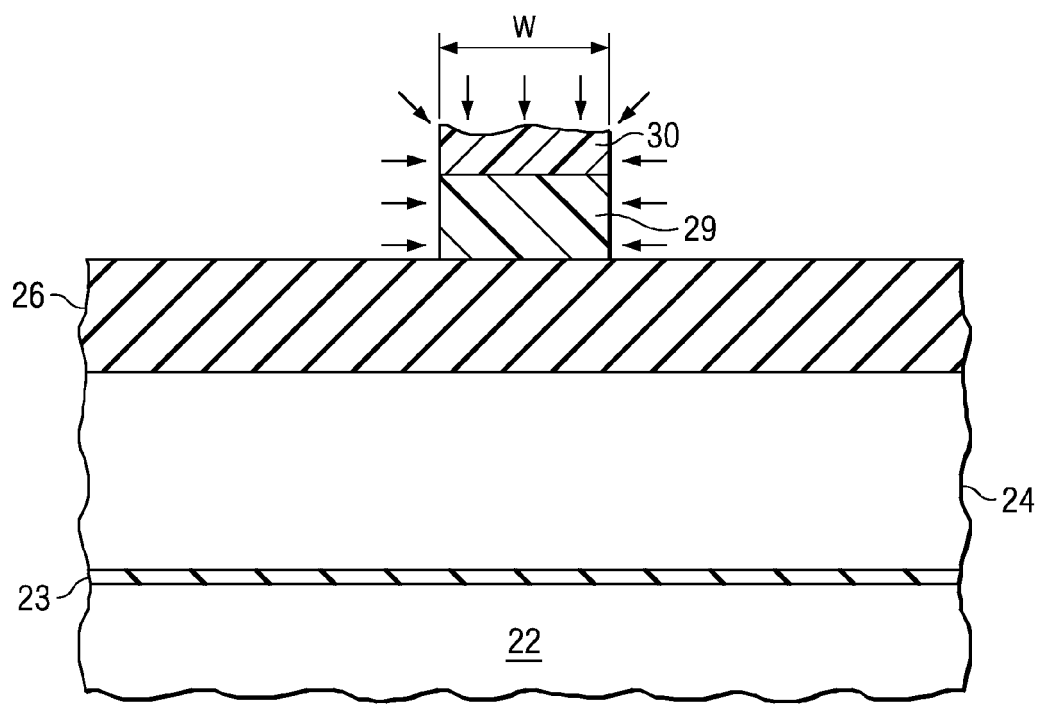

FIG. 2c illustrates the trimming of BARC element 29 according to the preferred embodiment of the invention. As shown in FIG. 2c, after the removal of remaining photoresist 30, BARC element 29 is subjected to a substantially isotropic timed etch using conventional reagents, to trim its width W from the photolithographic minimum to a sub-lithographic width. This etch need not be perfectly isotropic and as such may have some anisotropy (e.g., preferentially vertical); but of course, if the etch has some anisotropy, the etch designer should keep in mind that the primary purpose of this trim etch is to reduce the width of BARC element 29 while still maintaining it sufficiently thick to permit transfer of the pattern to underlying layers. The isotropic nature of the trim process will also tend to remove photoresist 30 remaining at the surface of BARC element 29, and may even thin BARC element 29. To the extent that photoresist 30 remained after transfer of the pattern to BARC element 29, this material is preferably left in place during this trim because it helps to protect the thickness of BARC element 29 during its trim and etch, and also because it is difficult to remove photoresist 30 without adversely impacting BARC element 29.

Figure 2D:
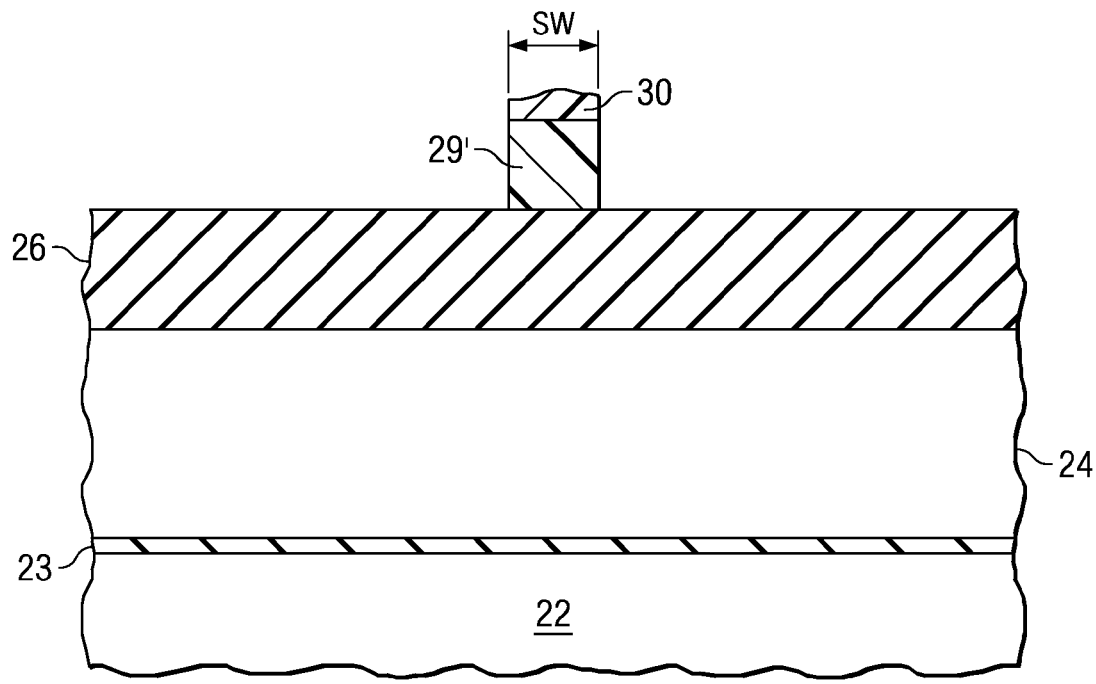

The result of this trimming of BARC element 29 is illustrated in FIG. 2d, with trimmed BARC element 29' having a width SW that is substantially narrower than the patterned width W (and with some photoresist 30 still remaining at the surface of BARC element 29, in this example). For example, it is contemplated that BARC element 29 may be trimmed from a patterned width W of about 100 nm to a trimmed width SW of 45 nm or less. The thickness of trimmed BARC element 29' is preferably sufficient to withstand the subsequent etch of hardmask layer 26, or at least to withstand this subsequent hardmask etch to the extent that the remaining hardmask is thick enough to withstand the subsequent polysilicon etch, as will be described below. For example, a suitable thickness of trimmed BARC element 29' is on the order of 40 nm, for masking an etch of a 50 nm thick silicon-rich nitride film 26.

Figure 2E:
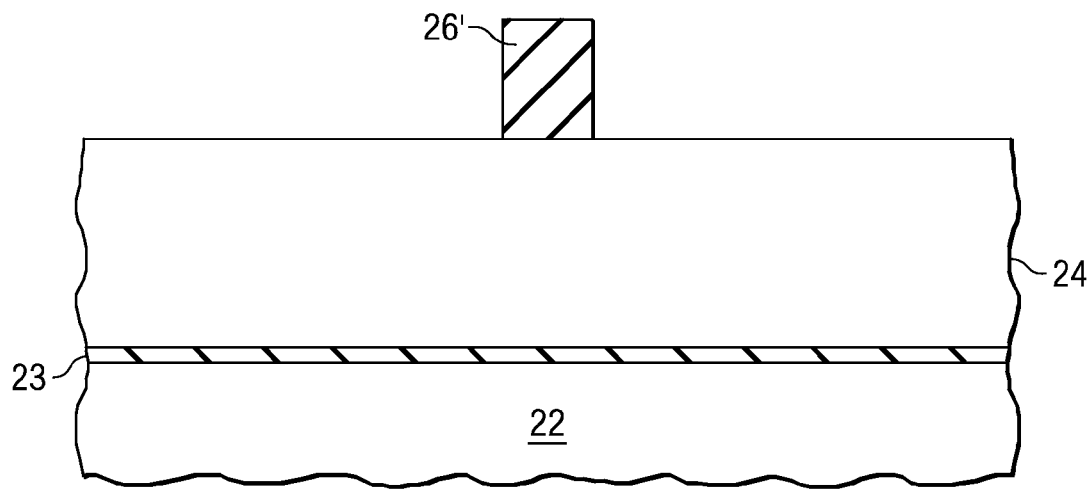

Hardmask layer 26 is next etched, using trimmed BARC element 29' as a mask. This etch is preferably a substantially anisotropic etch, using conventional reagents and etch conditions for the etching of the material of hardmask layer 26. For example, the etching of hardmask layer 26 consisting of a 50 nm silicon-rich nitride film can be carried out by way of a plasma etch using fluorine as the active species, for example from $CHF_3$, $CF_4$, or a mixture of the two; other reagents such as NO may also be used. This etch need not be perfectly anisotropic, but should be primarily anisotropic so that the critical dimension of the width of the resulting hardmask structure is closely controlled while still maintaining much of its thickness. To the extent that any portion of trimmed BARC element 29' remains after this etch, it may be removed by conventional cleanup, such as an $O_2$ or $O_2/N_2$ plasma ash, which may be performed in the same etch chamber used for the etching of hardmask layer 26 and polysilicon layer 24. The result of the etch of hardmask layer 26 is illustrated in FIG. 2e. The width of the remaining hardmask element 26' at the location at which the gate electrode is to be formed corresponds to the width SW of trimmed BARC element 29'. The thickness, or height, of remaining hardmask element 26' is preferably sufficient to withstand the subsequent etch of polysilicon layer 24. For example, hardmask element 26' is preferably about 50 nm thick, for an underlying polysilicon layer 24 that is 120 nm thick.

Figure 2F:
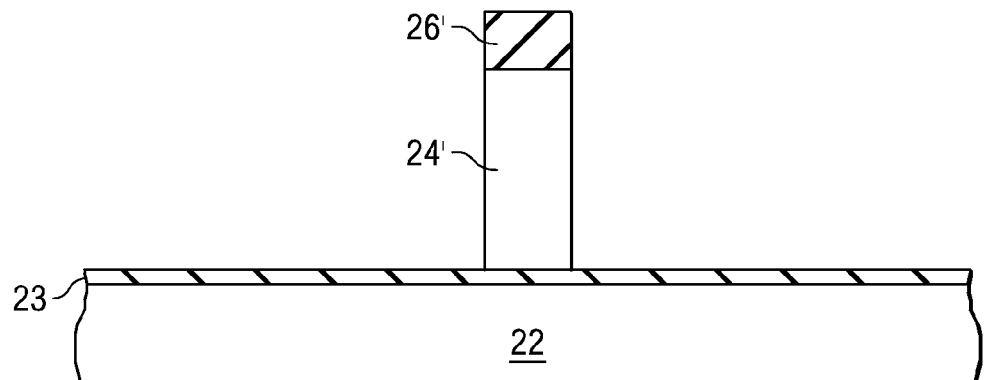

Polysilicon layer 24 is then etched, preferably with a conventional anisotropic polysilicon etch, using hardmask element 26' as a mask. Hardmask element 26' may be thinned by this polysilicon etch, but as mentioned above, it is preferably of sufficient thickness to remain in place until polysilicon layer 24 is cleared from the unmasked regions of substrate 22. The result of this polysilicon etch is illustrated in FIG. 2f, with polysilicon gate electrode 24' remaining at the desired location after polysilicon etch. In this example, a thinned portion of hardmask element 26' remains in place. But because of its material (e.g., silicon-rich nitride), it is contemplated that this remaining hardmask element 26' can be easily removed by a wet cleanup, clearing the surface of polysilicon gate electrode 24'.

The ability to easily remove hardmask element 26' according to this embodiment of the invention not only simplifies the process, but in fact provides additional optimization in the design of the polysilicon etch. As mentioned above, the conventional process uses silicon oxynitride in a bilayer hardmask. But because this silicon oxynitride is extremely difficult to remove by a post-etch cleanup, the polysilicon etch in this conventional process is constrained to ensure that the silicon oxynitride top layer of the hardmask is completely consumed in the polysilicon etch. This is further constrained by the thickness of the silicon oxynitride being selected for anti-reflective properties relative to the underlying silicon-rich nitride. In contrast, there is no such constraint according to the method of this preferred embodiment of the invention. The duration, reagents, and etch conditions for the etch of polysilicon layer 24 can be optimized for this polysilicon etch, and need not be concerned with the removal of difficult materials such as silicon oxynitride. This additional degree of freedom for the polysilicon etch will result in ensuring that the dimensions of the critical gate electrode features can be closely and reliably controlled, along with avoiding filaments at steps in the polysilicon and the like. This additional degree of freedom can also be useful in closely controlling the profile of the resulting gate electrode defined by this polysilicon etch.

Figure 3:
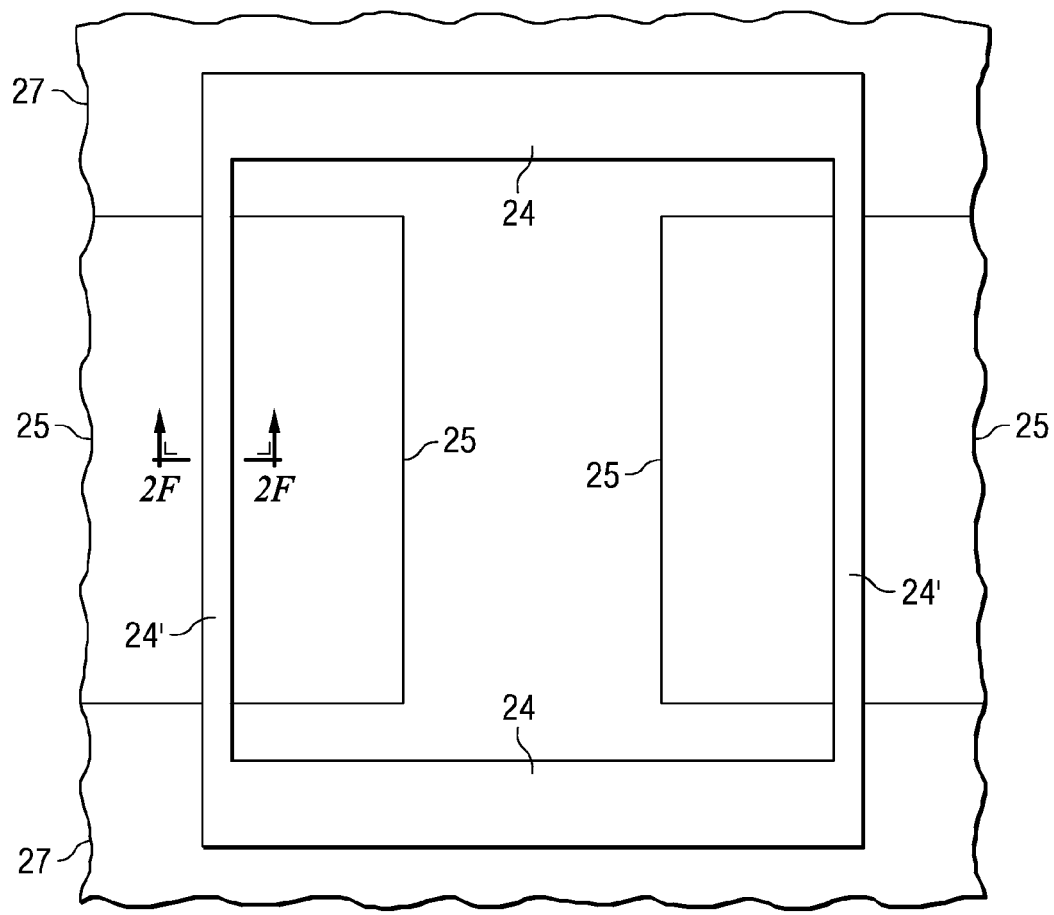
FIG. 3 is a plan view of an example of a structure formed by the method according to the preferred embodiment of the invention.

FIG. 3 illustrates, in plan view, a pair of typical transistors formed at a surface of substrate 22 according to this embodiment of the invention. Moat regions 25 are disposed at selected locations of the surface of substrate 22, specifically at locations not otherwise covered by isolation oxide 27 as shown. A single polysilicon structure 24 including gate electrodes 24 extends over moat regions 25, with relatively wide features at portions overlying isolation oxide 27. Gate electrodes 24', formed according to the process described above relative to FIGS. 2a through 2f, extend between these wider features, across moat regions 25. As shown in FIG. 3, gate electrodes 24' are unitary with good integrity along their lengths, despite being formed to an extremely narrow sub-lithographic width. This integrity is in stark contrast to the failures described above that result from the conventional process of FIG. 1a through 1d.

As is well-known in the art, processes subsequent to the formation of gate electrodes 24' according to this preferred embodiment of the invention can now be performed to complete the fabrication of transistors and other devices in the integrated circuit. These subsequent processes include the ion implantation and anneals for forming source and drain diffusion regions on either side of gate electrodes 24' in moat regions 25 of FIG. 3, in the conventional self-aligned manner. Moat regions 25 and polysilicon structure 25 may be then silicide-clad in the conventional manner, as known in the art. Additional conductor levels of polysilicon or metal, separated by interlevel dielectric layers, are then typically added as known in the art. Upon completion of the fabrication of the integrated circuit, electrical test and packaging of the integrated circuits is then carried out, as well known in the art. The specific materials, layout, number of levels, and other attributes of these subsequent processes will, of course, depend upon the particular integrated circuit being fabricated and the technology used for such fabrication.

This invention provides important benefits in the manufacture of integrated circuits, specifically in the formation of physical features of so-called critical dimension. According to this invention, minimum dimension features, such as MOS transistor gate electrodes, can be reliably formed to dimensions that are less than that achievable by conventional photolithography. More specifically, the masking structures used to form these features have good structural integrity, avoiding a common limitation of conventional patterned masking materials for forming these structures. In addition, the masking materials can be selected to provide low reflections in photolithography, while being easily removed by post-etch cleanups; as a result, the etch of the gate electrode layer can be optimized for its own properties, without being constrained by the removal of masking material as in conventional processes.

It is contemplated that various alternatives to the preferred embodiment of the invention will be apparent to those skilled in the art having reference to this specification. Of course, the particular thicknesses and composition of the layers can vary according to the particular process implementation. For example, the thickness of silicon-rich nitride layer 26 can vary in thickness, and in its composition (i.e., the concentration of silicon in the film), to obtain the desired optical properties for particular thicknesses of polysilicon layer 24 and the other layers in the gate stack structure. By way of further example, it has been observed, in connection with this invention, that the indices of absorption and refraction of a silicon-rich nitride film vary with the silicon concentration in the film. This invention thus provides another degree of freedom in the selection of this silicon concentration for optimal optical properties, as well as in selecting the particular film thicknesses, because etch of the hardmask layer is not constrained by also having to simultaneously remove an overlying silicon oxynitride film, as is necessary in conventional processes. Other alternative approaches contemplated by this invention include the including of additional layers in the gate stack, such as a silicon dioxide layer underlying the silicon-rich nitride hardmask layer that can be included to further adjust and optimize the optical properties of the stack.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating a feature in an integrated circuit structure, comprising:
   forming a feature layer near a semiconducting surface of a substrate;
   forming a hardmask layer over the feature layer;
   forming an anti-reflective coating over the hardmask layer;
   patterning photoresist over the anti-reflective coating, to expose selected locations of the anti-reflective coating;
   removing the exposed portions of the anti-reflective coating;
   then trimming remaining portions of the anti-reflective coating to reduce their width;
   etching the hardmask layer, using trimmed remaining portions of the anti-reflective coating as a mask, to expose selected locations of the feature layer;
   etching the exposed locations of the feature layer, using remaining portions of the hardmask layer as a mask; and
   removing the remaining portions of the hardmask layer.

2. The method of claim 1, further comprising:
   after the step of etching the hardmask layer, removing remaining portions of the anti-reflective coating.

3. The method of claim 1, wherein the anti-reflective coating comprises an organic BARC layer.

4. The method of claim 1, wherein the hardmask layer comprises silicon-rich nitride.

5. The method of claim 1, wherein the step of removing remaining portions of the hardmask layer comprises performing a wet cleanup.

6. The method of claim 1, wherein the hardmask layer comprises silicon-rich oxynitride.

7. The method of claim 1, wherein the feature layer comprises polycrystalline silicon.

8. The method of claim 1, wherein the trimming step comprises:
   etching the anti-reflective layer substantially isotropically, for a selected time.

9. The method of claim 8, further comprising:
   after the step of removing exposed portions of the anti-reflective coating and before the isotropically etching step, removing remaining photoresist.

10. A method of forming a transistor for an integrated circuit, comprising:
    forming a gate dielectric layer at a semiconducting surface of a substrate;
    forming a gate layer over the gate dielectric layer;
    forming a hardmask layer over the gate layer;
    forming an anti-reflective coating over the hardmask layer;
    patterning photoresist over the anti-reflective coating, to expose selected locations of the anti-reflective coating;
    removing the exposed portions of the anti-reflective coating;
    then trimming remaining portions of the anti-reflective coating to reduce their width;
    etching the hardmask layer, using trimmed remaining portions of the anti-reflective coating as a mask, to expose selected locations of the gate layer;
    etching the exposed locations of the gate layer, using remaining portions of the hardmask layer as a mask, to define a gate electrode; and
    removing the remaining portions of the hardmask layer.

11. The method of claim 10, further comprising:
    forming source and drain regions in the semiconducting surface adjacent the gate electrode.

12. The method of claim 10, further comprising:
    after the step of etching the hardmask layer, removing remaining portions of the anti-reflective coating.

13. The method of claim 10, wherein the anti-reflective coating comprises an organic BARC layer.

14. The method of claim 10, wherein the hardmask layer comprises silicon-rich nitride.

15. The method of claim 10, wherein the step of removing remaining portions of the hardmask layer comprises performing a wet cleanup.

16. The method of claim 10, wherein the hardmask layer comprises silicon-rich oxynitride.

17. The method of claim 10, wherein the gate layer comprises polycrystalline silicon.

18. The method of claim 10, wherein the trimming step comprises:

isotropically etching the anti-reflective layer for a selected time.

19. The method of claim 18, further comprising:

after the step of removing exposed portions of the anti-reflective coating and before the isotropically etching step, removing remaining photoresist.

* * * * *